(12) United States Patent
Ruby

(10) Patent No.: US 6,384,697 B1
(45) Date of Patent: May 7, 2002

(54) CAVITY SPANNING BOTTOM ELECTRODE OF A SUBSTRATE-MOUNTED BULK WAVE ACOUSTIC RESONATOR

(75) Inventor: Richard C. Ruby, Menlo Park, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/566,868

(22) Filed: May 8, 2000

(51) Int. Cl.[7] .................................................. H03H 9/00
(52) U.S. Cl. .......................................... 333/189; 333/187
(58) Field of Search .................................. 333/189, 133, 333/187; 29/25.35

(56) References Cited

U.S. PATENT DOCUMENTS

| | | | |
|---|---|---|---|
| 5,075,641 A | * 12/1991 | Weber et al. | 331/108 C |
| 5,404,628 A | * 4/1995 | Ketcham | 29/25.35 |
| 5,587,620 A | 12/1996 | Ruby et al. | 310/346 |
| 5,696,423 A | * 12/1997 | Dydyk et al. | 310/346 |
| 5,780,713 A | 7/1998 | Ruby | 73/1.82 |
| 5,873,153 A | 2/1999 | Ruby et al. | 29/25.35 |
| 5,873,154 A | 2/1999 | Ylilammi et al. | 29/25.35 |
| 6,204,737 B1 | * 3/2001 | Ella | 333/187 |
| 6,262,637 B1 | * 7/2001 | Bradley et al. | 333/133 |

* cited by examiner

Primary Examiner—Robert Pascal
Assistant Examiner—Dean Takaoka

(57) ABSTRACT

A filter formed of acoustic resonators, where each resonator has its own cavity and a bottom electrode that spans the entirety of the cavity, so that the bottom electrode has an unsupported interior region surrounded by supported peripheral regions. In the preferred embodiment, the cavity is formed by etching a depression into the substrate, filling the depression with a sacrificial material, depositing the piezoelectric and electrode layers that define an FBAR or SBAR, and then removing the sacrificial material from the depression. Also in the preferred embodiment, the sacrificial material is removed via release holes that are limited to the periphery of the depression. Preferably, the bottom electrode is the only electrode that spans the cavity, thereby limiting the formation of parasitic FBARs or SBARs. In one embodiment, the bottom electrode includes a serpentine edge that leaves a portion of one side of the cavity free of overlap by the bottom electrode, so that a top electrode may overlap this portion. Thus, the top and bottom electrodes can overlap the same side without sandwiching the piezoelectric layer outside of the unsupported interior region.

21 Claims, 6 Drawing Sheets

CAVITY SPANNING BOTTOM ELECTRODE OF A SUBSTRATE-MOUNTED BULK WAVE ACOUSTIC RESONATOR

TECHNICAL FIELD

The invention relates generally to acoustic resonators and more particularly to approaches for supporting an acoustic resonator on a substrate.

BACKGROUND ART

Acoustic resonators that are formed of thin films may be used in a number of applications that require a precisely controlled frequency. A Thin Film Bulk Acoustic Resonator (FBAR) or a Stacked Thin Film Bulk Acoustic Resonator (SBAR) may be used as a filter in a cellular telephone or other device in which size, cost and frequency stability are important factors.

An FBAR includes a thin film of piezoelectric material between two conductive electrodes, while an SBAR includes additional layers of piezoelectric material, with each such layer separating two electrodes. The active layers of an FBAR or SBAR are suspended in air by supporting the layers around the perimeter. The air/resonator interfaces at both sides of the stack of layers trap the energy that is generated during operation.

When a time-varying electrical field is created by applying a signal across two electrodes that are separated by a piezoelectric layer, the piezoelectric material converts some of the electrical energy into mechanical energy in the form of sound waves. The sound waves propagate in the same direction as the electrical field and are reflected at the air/resonator interfaces. For a properly fabricated FBAR or SBAR, the sound waves will have a particular mechanical resonance.

An FBAR or SBAR can be used as a filter, since it will function as an electronic resonator when allowed to operate at its mechanical resonant frequency. At this mechanical resonant frequency, the half wavelength of the sound waves propagating through the resonator is approximately equal to the total thickness of the resonator for a given phase velocity of sound in the piezoelectric material. Since the velocity of sound is many orders of magnitude smaller than the velocity of light, the resulting resonator can be compact. A resonator for applications in which a frequency in the gigahertz range is desired may be constructed with physical dimensions less than 100 microns in diameter and a few microns in thickness.

An FBAR is conventionally fabricated on the surface of the substrate by depositing the bottom electrode, the piezoelectric film, and then the top electrode. Therefore, a top air/resonator interface exists and only the bottom interface requires some design selections. There are several known approaches for obtaining the desired characteristics at the bottom interface.

The first approach involves etching away the substrate material from the back side of the substrate. If the substrate is silicon, the silicon is etched away from the back side using a KOH etch, which is a strong base etchant. This approach is described in detail in U.S. Pat. No. 5,587,620 to Ruby et al. With reference to FIG. 1, a layer 10 of $Si_3N_4$ may be deposited on a top surface of a silicon substrate 12. The back side of the substrate 12 is then etched using the KOH. Preferably, approximately 80% of the silicon substrate is removed during the etching step, leaving a remainder 14 that provides structural stability. The metallization of the bottom electrode 16 is then formed on the $Si_3N_4$ layer 10. Aluminum nitride (AlN) may then be deposited as the piezoelectric layer 18. A second electrode 20 is subsequently formed on the surface of the piezoelectric layer 18. As shown in FIG. 2, if an SBAR is to be fabricated, rather than an FBAR, a second piezoelectric layer 22 and a third electrode 24 are also formed.

After completing the fabrication of the third electrode 24, the remainder 14 of the silicon within the previously etched cavity is removed by a slow etching process that is more easily controlled than the KOH etch. For example, a tetra-methyl-ammonium hydroxide (TMAH) etching solution may be used, since it is less likely to attack the AlN of the piezoelectric layers 18 and 22. The result is that an SBAR 26 of FIG. 2 is formed.

One concern with this first approach is that it results in a relatively low fabrication yield. The cavities that are formed through the wafer 12 render the wafer very delicate and highly susceptible to breakage. Furthermore, the wet etching using KOH forms side walls having 54.7° slopes. This limits the ultimate density of fabricating the acoustic resonators on a given sized wafer. For example, devices with lateral dimensions of approximately 150 μm×150 μm that are built on a standard 530 μm thick silicon wafer require a back side etch hole that is roughly 450 μm×450 μm. Consequently, only approximately 11% of the wafer can be productively utilized.

A second approach to forming the air/resonator interfaces is to create an air bridge type FBAR/SBAR device. Typically, a sacrificial layer is deposited and the acoustic resonator layer stack is then fabricated on top of the sacrificial layer. At or near the end of the process, the sacrificial layer is removed. Since all of the processing is completed on the front side, this approach does not suffer from having two-sided alignment and large area back side cavities. However, this approach has other inherent difficulties. First, the method is difficult to practice on large devices. Typically, the sacrificial layer is thermally grown silicon dioxide that is subsequently removed using hydrofluoric (HF) gas, which has an etch rate in the order of 1000 to 3000 Å/minute. To etch beneath device areas that are in the order of 150 μm×150 μm or larger, an etch time greater than 500 minutes is required. In addition to being excessively long, the exposure of the metal electrodes to the etchant for periods in excess of 30 minutes leads to the delamination of the metal electrodes from the piezoelectric material.

A third approach is sometimes referred to as the "solidly mounted resonator" (SMR), since there are no air gaps at the bottom of the device. A large acoustic impedance at the bottom of the device is created by using an acoustic Bragg reflector. The Bragg reflector is made of layers of alternating high and low acoustic impedance materials. Each thickness is fixed to be at the quarter wavelength of the resonant frequency. With sufficient layers, the effective impedance of the piezoelectric/electrode interface is much higher than the device acoustic impedance, thereby trapping the sound waves effectively within the piezoelectric layer. While this approach avoids some of the problems discussed with regard to creating a free-standing membrane, it includes difficulties. The choice of materials used in the Bragg reflector is limited, since metal layers would form parasitic capacitors that would degrade the electrical performance of the device. Moreover, the degree of difference in the acoustic impedance of layers made by the available dielectric materials is not large, so that more layers are needed. This complicates the fabrication process as the stress on each layer must be well controlled. After many layers, the device is not conducive to integration with other active elements, since making vias through a large number of holes is difficult. Furthermore, devices of this type are reported to have significantly lower effective coupling coefficients than devices having air bridges.

Acoustic resonators may be used alone or in combination. For example, a bandpass filter is formed by electrically connecting several resonators to provide a desired filter response. Several filter topologies are possible. One favored topology is the half-ladder topology, where a group of resonators are connected in series (series resonators) and in between the series resonators are shunt resonators that are connected to ground. The series resonators are fabricated such that their resonant frequency is approximately 2% to 3% higher than the shunt resonators. Since the thickness of the piezoelectric layer can be the same for the series and shunt resonators, the piezoelectric deposition is often "shared" between resonators. In fact, it is tempting for a designer to use the piezoelectric layer as a membrane that provides the chief supporting structure spanning the backside KOH-etched cavities that were described above. This "sharing" of the piezoelectric layer helps to mitigate the loss of board real estate that results from the 54.7° etch angle.

Regardless of the approach for forming the air/resonator interface, the conventional thinking is that the top and bottom electrodes should be on the opposite sides of only free-standing regions of the piezoelectric layer. This isolates the area in which acoustic energy is being generated to free-standing regions, so that the acoustic energy is less likely to be lost into the underlying substrate. It is also conventional thinking that as a result of the goal of achieving component minimization, providing separate resonators with separate cavities would be undesirable.

What is needed is a method of fabricating an acoustic resonator having a free-standing portion that is able to withstand a wide range of stresses, both compressive and tensile, and which exhibits a relatively high figure of merit (Q).

SUMMARY OF THE INVENTION

A filter is formed using robust and high Q acoustic resonators, where each resonator has its own cavity and includes a bottom electrode which extends across substantially the entirety of an open area that is formed within a supporting substrate. The bottom electrode contacts all sides of the open area, so that it includes an unsupported interior region within supported peripheral regions. The bottom electrode is one layer of a layer stack that includes at least one piezoelectric layer and at least one other electrode layer. This results in a significant improvement relative to acoustic resonators in which the bottom electrode has at least one edge within the unsupported region of the layer stack.

In one embodiment of the invention, the open area is formed within the substrate by etching a cavity from the surface on which the acoustic resonator layer stack is to be deposited. The cavity extends only partially through the substrate, which may be a silicon wafer. The cavity is then filled with a sacrificial material which is subsequently removed.

The bottom electrode is preferably formed directly atop the sacrificial material, but an intermediate layer may be included. The bottom electrode extends beyond the sacrificial material at all sides of the cavity. If the cavity is formed by an anisotropic etching step, the cavity will likely have at least three sides. Thus, the bottom electrode will have a supported interior region and three or more substrate-supported peripheral regions.

The piezoelectric layer is formed atop the bottom electrode. Preferably, the piezoelectric layer will extend beyond all edges of the bottom electrode. The piezoelectric material (e.g., AlN) is a columnar material that readily steps down at the edges of the bottom electrode. This characteristic of the piezoelectric material causes a reduction in performance when an edge of the bottom electrode terminates within the cavity region, as in the conventional approach. Using this conventional approach of having an unsupported step down, the distorted and poorly formed columnar piezoelectric membrane at the unsupported step edge will adversely affect electrical performance. Furthermore, the step down creates a mechanical weakness in the structural membrane, thereby potentially leading to cracks. On the other hand, by providing overlap of the bottom electrode onto all of the sides of the cavity, the figure of merit (Q) is increased.

Preferably, the top electrode includes sides that reside within the area defined by the cavity. For example, three sides of the top electrode may be within the "frame" of the cavity, so that only one edge overlaps the edge of the cavity and resides on the portion of the silicon that is in contact with the layer stack. This reduces the effects of any parasitic FBARs or SBARs that are formed at the bottom electrode step edges.

After the layer stack has been deposited, the sacrificial material is removed from the cavity. Release holes for removing the material may be formed within the layer stack. However, the preferred embodiment limits the release holes to the perimeter of the cavity. It has been discovered that this enhances the Q of the acoustic resonator, since there are fewer internal discontinuities that will cause conversion or loss of lateral mode energy.

In one embodiment, the bottom electrode includes a serpentine edge that leaves a portion of one side of the cavity free of overlap by the bottom electrode, so that a top electrode may overlap this portion. Thus, the top and bottom electrodes can overlap the same side without sandwiching the piezoelectric layer outside of the unsupported interior region.

One advantage of the invention is that by placing the step edge of the bottom electrode and piezoelectric material away from the cavity, the free-standing portion of the acoustic resonator becomes much stronger and is able to withstand a wider range of stresses, both compressive and tensile. Another advantage is that moving the bottom electrode step edge away from the cavity increases the Q. In the conventional approach of placing the edge of the bottom electrode within the cavity, any lateral mode energy that is generated will be reflected from the poorly formed piezoelectric material at the step edges. Some of the energy is mode converted and lost, while another portion is directly converted to heat by incoherent collisions with voids and impurities found at the poorly formed edge. However, by placing the edge onto the surface of the substrate, the edges of the cavity function as highly reflecting edges that reflect the energy back into the free-standing portion of the acoustic resonator. This reflection returns some of the energy from the parasitic lateral mode.

The range of film stresses tolerated by an acoustic resonator formed in accordance with the invention was considerable. Devices were formed with film stresses as high as $6*10^9$ Dynes/cm$^2$ compression and nearly $10^{10}$ Dynes/cm$^2$ tensile. Other designs began to fail (i.e., crack or buckle) at much lower film stresses. Improvements in Q were at least a factor of two. It was found that a further 10% to 20% improvement was a result of moving the release holes from the center of the free-standing portion to the edges of the cavity.

DETAILED DESCRIPTION

Figure 1:
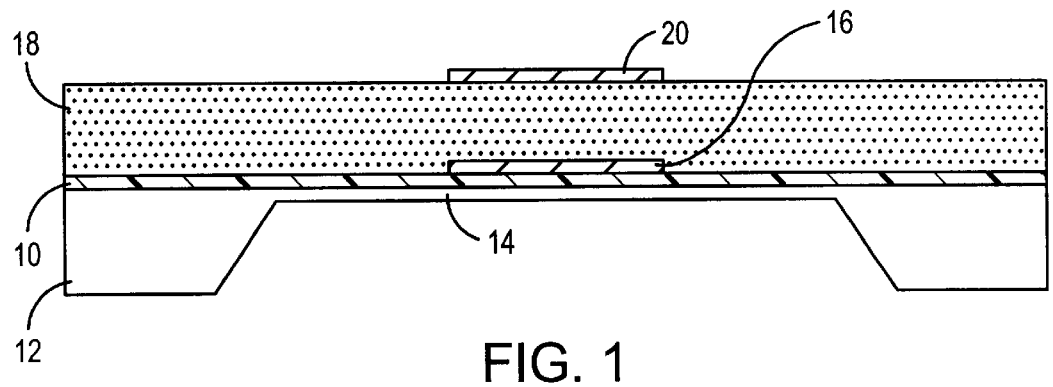
FIG. 1 is a side sectional view of a partially fabricated SBAR in accordance with one prior art approach.
Figure 2:
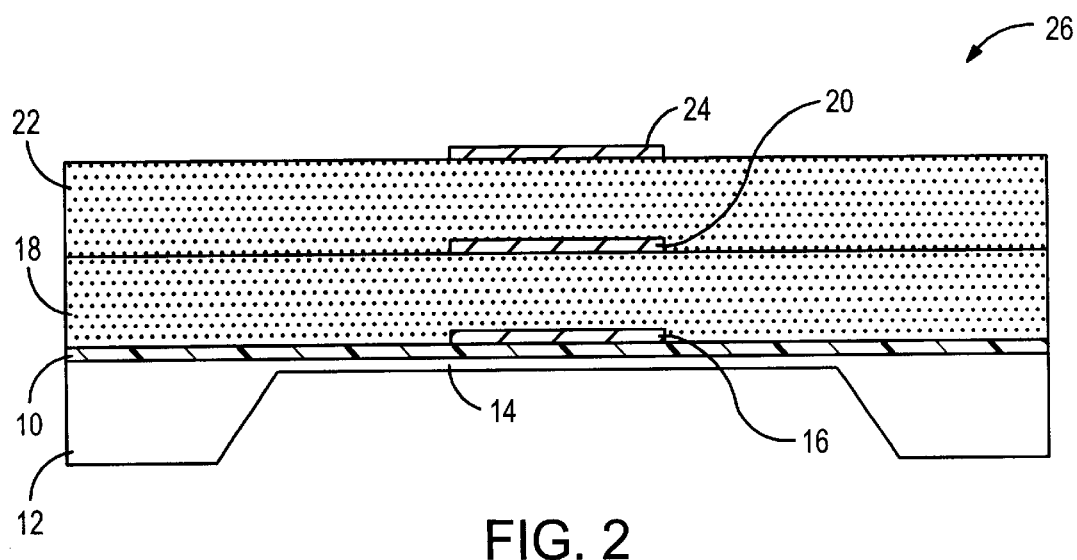
FIG. 2 is a side sectional view of the SBAR of FIG. 1 following additional fabrication steps.
Figure 3:
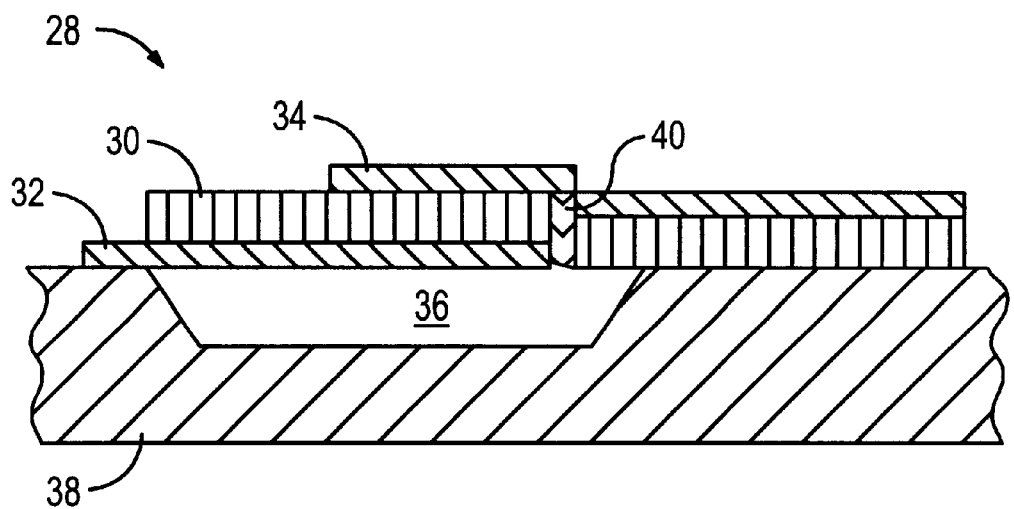
FIG. 3 is a side sectional view of an FBAR formed in accordance with steps described in U.S. patent application Ser. No. 09,088,964, which is assigned to the assignee of the present invention.
Figure 4:
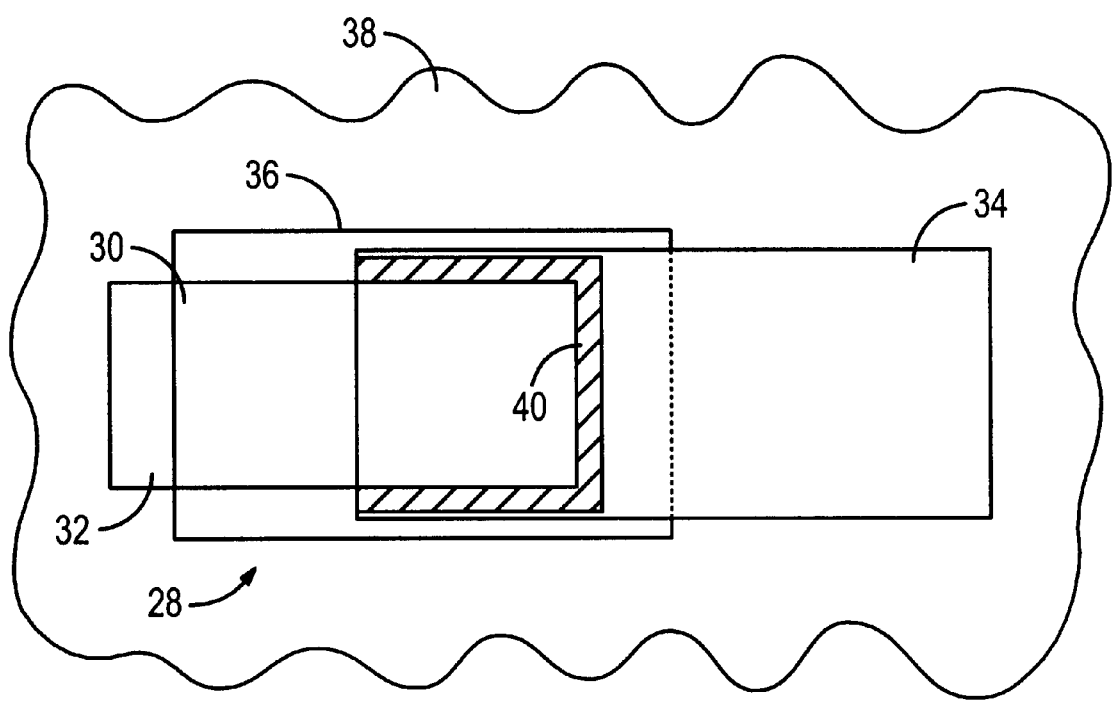
FIG. 4 is a top view of the FBAR of FIG. 3.

The invention can be more easily understood by referring to a prior approach to forming an FBAR. The approach that is described in U.S. patent application Ser. No. 09/088,964 of Ruby et al., which is assigned to the assignee of the present invention, results in the FBAR 28 illustrated in FIGS. 3 and 4. The FBAR includes a piezoelectric layer 30 sandwiched between a bottom electrode 32 and a top electrode 34. The conventional approach has been to place the bottom electrode of the free-standing portion of the acoustic resonator over one edge, but not cover (i.e., overlap) all of the edges of the support frame that is defined by the etching of the cavity 36. A typical material for the piezoelectric layer 30 is aluminum nitride (AlN), which is a columnar material that is distorted and poorly formed at the step edge of the bottom electrode 32. This poor formation is represented by the region 40 in FIGS. 3 and 4. The poorly formed region extends along all of the unsupported edges of the bottom electrode, as indicated by the hatched three-sided region 40 in FIG. 4.

Figure 9:
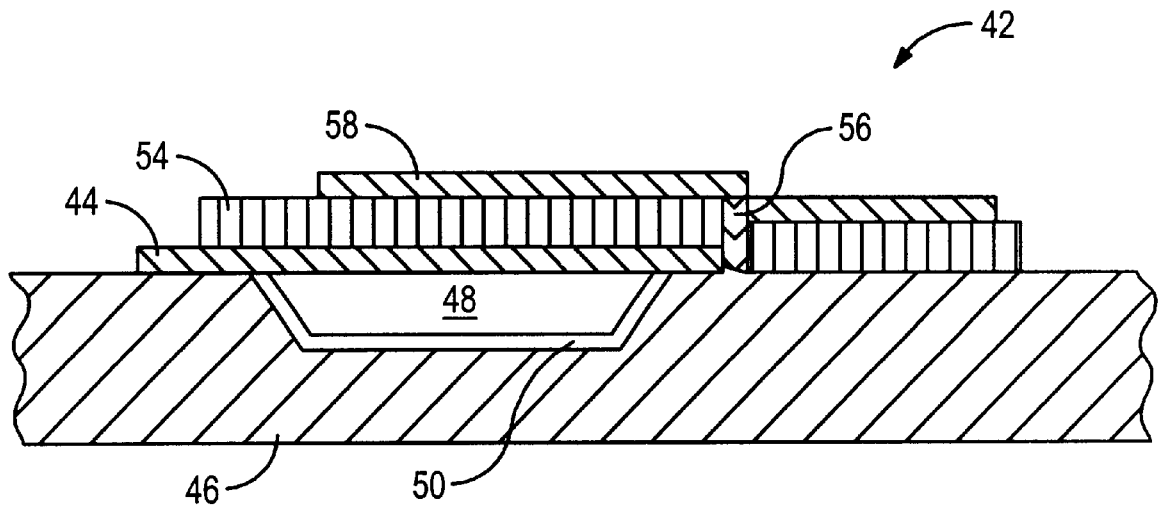
FIG. 9 is a side sectional view of the substrate of FIG. 8 after the sacrificial material has been removed from the cavity formed in FIG. 5.
Figure 10:
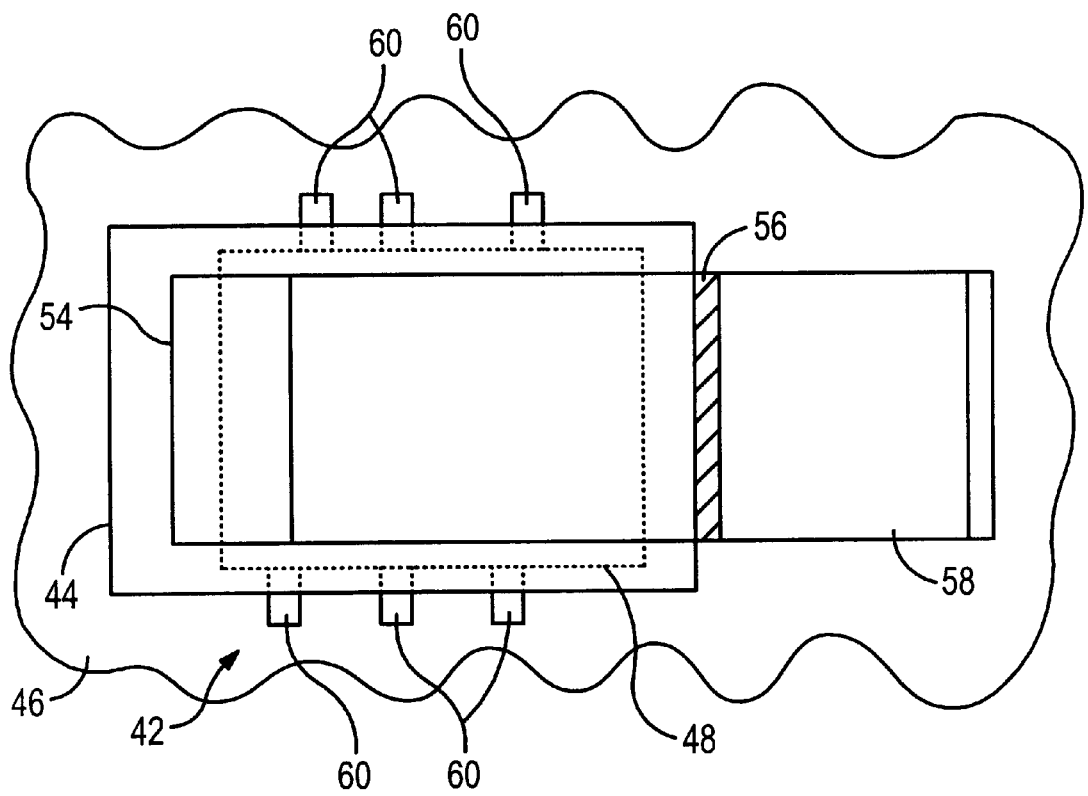
FIG. 10 is a top view of the FBAR of FIG. 9.

Referring briefly to the FBAR 42 of FIGS. 9 and 10, the edges of the bottom electrode 44 have been removed from the unsupported interior region of the layer stack, so that all edges of the bottom electrode contact the substrate 46. Relative to the FBAR 28 of FIGS. 3 and 4, the FBAR 42 has a slightly lower coupling coefficient (i.e., kt2), due to the parasitic overlap in which both of the electrodes 44 and 58 and the piezoelectric layer 54 reside directly on the substrate 46. However, the reduction in the coupling coefficient is more than offset by the increase in the figure of merit (Q). Since performance is measured by the product of the coupling coefficient and Q, the overall performance of the FBAR 42 is enhanced by forming the bottom electrode to extend beyond all sides of a bottom resonator/air interface.

Figure 5:
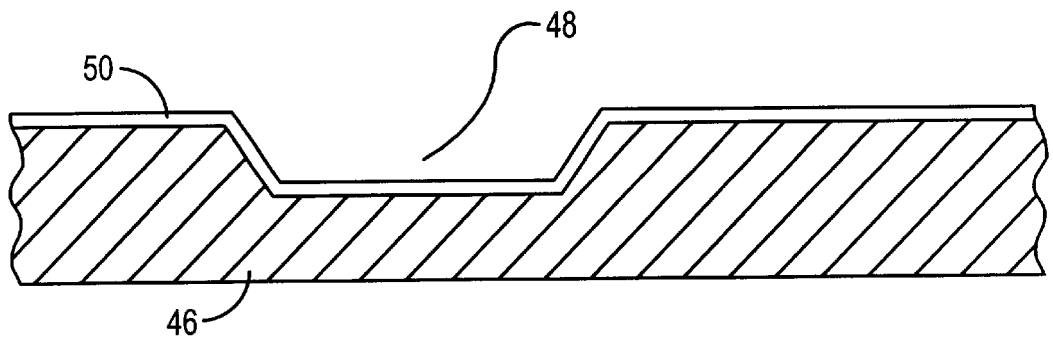
FIG. 5 is a side sectional view of a first step of forming an FBAR or SBAR in accordance with the invention.

The process for forming the FBAR 42 of FIGS. 9 and 10 will be described with reference to FIGS. 5–8. In FIG. 5, a portion of the substrate 46 is shown as including a depression 48. The means for forming the depression is not critical to the invention. A KOH etch may be used to anisotropically etch the depression to include side walls with a 54.7° slope, as is well known in the art. The etch is terminated before an opening is formed through the entirety of the substrate 46. Thus, an inverted and truncated pyramidal configuration is formed. The distance across the depression at its uppermost extent, as viewed in the orientation of FIG. 5, may be 30 μm. It should be noted that the depth of the depression under the FBAR stack that is subsequently formed need only be sufficiently decoupled acoustically from the underlying substrate. Therefore, the depth may be less than 5 μm.

A thin layer of thermal oxide 50 is preferably grown on the surface of the silicon substrate 46 to prevent subsequently deposited films from diffusing into the substrate. Specifically, the concern is that phosphorous material will diffuse into the silicon substrate 46 from a sacrificial layer 52 of FIG. 6, converting the silicon into a conductor, which would interfere with the electrical operation of the final product.

Figure 6:
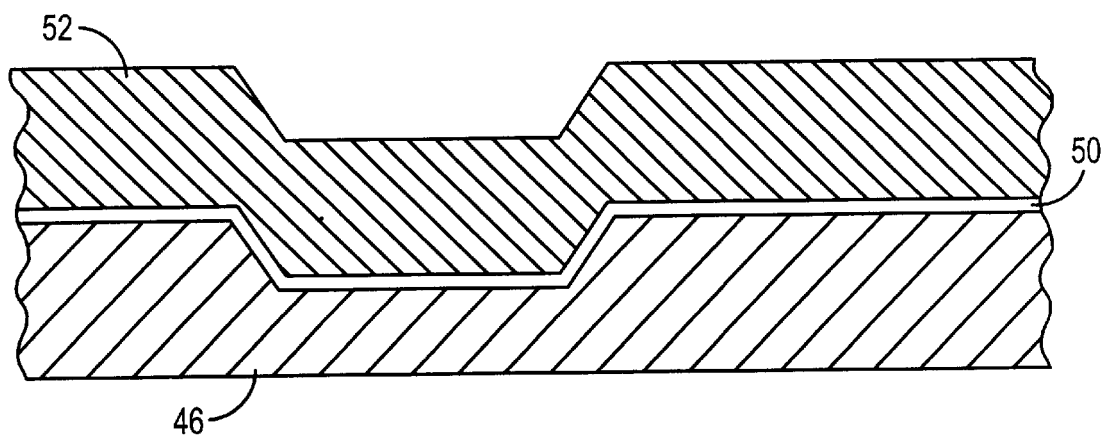
FIG. 6 is a side sectional view of the etched substrate of FIG. 5, with sacrificial material formed on a top surface.

In FIG. 6, the sacrificial layer 52 is deposited using known techniques. While not critical, the sacrificial layer may be phosphor-silica-glass (PSG). The PSG is deposited at a temperature of approximately 450° C., using silane and $P_2O_5$ sources to form a soft glass-like material which is approximately 8% phosphorous. This low temperature process is well known to those skilled in the art and will not be discussed in detail here. The PSG is the preferred choice for the sacrificial layer, since it is a very clean, inert material that can be deposited at the relatively low temperature and can be etched in a dilute $H_2O:HF$ solution at very high etch rate. At a dilution ratio of 10:1, etch rates on the order of 3 μm per minute are obtained.

Unfortunately, a native PSG sacrificial layer is a poor base for constructing an acoustic resonator. At the atomic level, the surface of such a layer is very rough. An acoustic resonator of the FBAR/SBAR type requires a piezoelectric material in which the crystals grow in columns that are perpendicular to the plane of the electrodes. Attempts to grow well-collimated piezoelectric films on the surface of a PSG layer result, at best, in poor polycrystalline material that exhibits little or no piezoelectric effects, because the many facets of the rough surface initiate crystal growth in a variety of directions.

Figure 7:
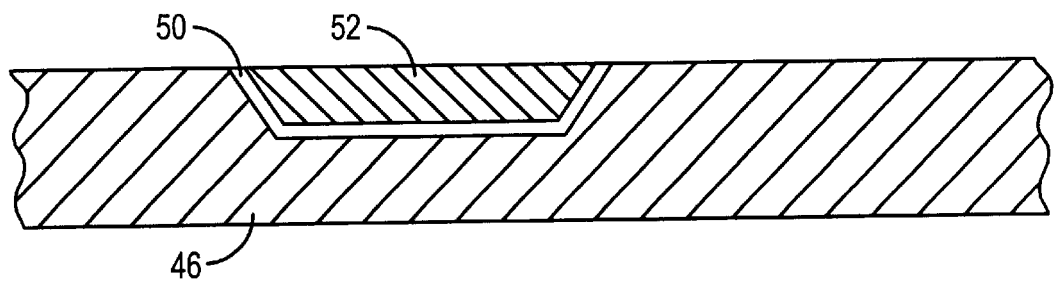
FIG. 7 is a side sectional view of the substrate of FIG. 6 with the sacrificial material being removed other than within the cavity etched in FIG. 5.

The difficulties associated with the use of PSG to form the sacrificial layer 52 may be overcome by polishing the surface of the PSG layer with a slurry to remove the upper portion of the PSG layer outside of the depression 48 formed in FIG. 5. The resulting structure is shown in FIG. 7. The remaining PSG sacrificial layer 52 can be polished using a more refined slurry. Alternatively, a single more refined slurry can be used for both polishing steps, if the additional polishing time is not objectionable. The goal is to create a "mirror-like" finish. While the thermal oxide 50 is shown as being polished from the surface of the substrate 46 other than below the sacrificial layer 52, this is not critical.

The cleaning of the silicon wafer 46 is also important. The slurry will leave bits of silica grit on the surface of the substrate. This grit must be removed. In the preferred embodiment, this is accomplished by using a second polishing wheel with a stiff, hard pad, such as the one sold under the trademark POLYTEX (Rodel, Conn.). Deionized water is used as the lubricant. After being polished, the substrate 46 is kept in deionized water until ready for the final cleaning step. The silicon substrate should not be allowed to dry between the last polish step and the last cleaning step. The last cleaning step consists of dipping the substrate in a series of tanks that hold various chemicals. Each tank is subjected to ultrasonic agitation. Such cleaning benches are well known in the art and will not be described in detail.

As a result of the process, a smooth surface of the substrate 46 and the sacrificial layer 52 provides a base for the deposition of highly textured c-axis piezoelectric material demonstrating excellent piezoelectric properties in spite of the fact that it does not contain a crystalline structure that "seeds" the piezoelectric layer.

While the above identification has indicated a specific polishing and cleaning regimen, other polishing and cleaning regimens may be substituted, if they provide a surface of the requisite smoothness. In the preferred embodiment, the final surface has an RMS (root-mean-squared) variation in height of less than 0.5 $\mu$m, as measured with an atomic force microscope probe.

Figure 8:
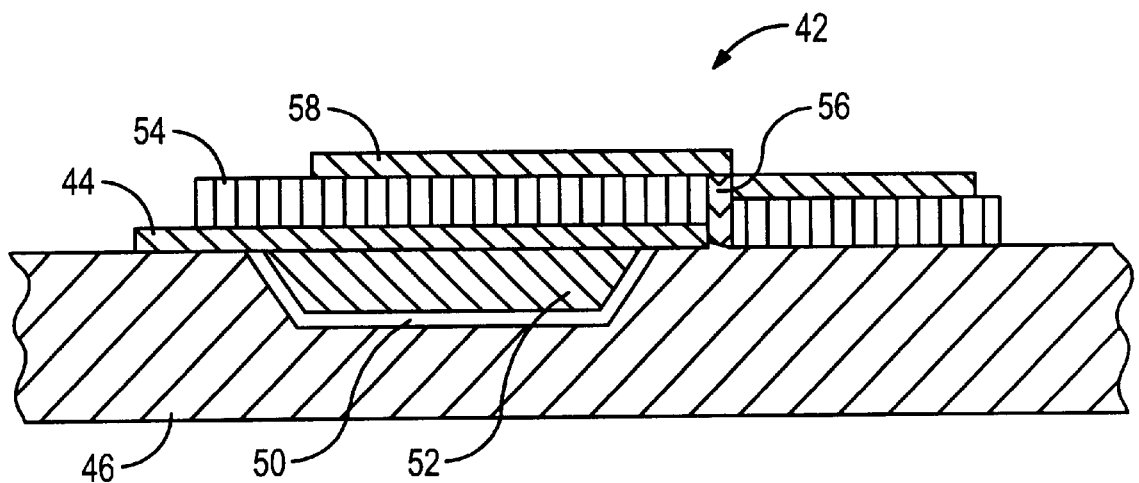
FIG. 8 is a side sectional view of the substrate of FIG. 7 after a layer stack has been formed to provide an acoustic resonator.

After the surface of the structure of FIG. 7 has been cleaned, the layers which form the acoustic resonator are deposited on the surfaces of the substrate 46 and the sacrificial layer 52. Referring now to FIG. 8, a first layer is the bottom electrode 44. The preferred electrode material is molybdenum, but other materials may be substituted. For example, the electrodes may be constructed of aluminum, tungsten, gold, platinum, palladium, or titanium. Molybdenum is preferred because of its low thermo-elastic loss. Molybdenum has approximately 56 times less thermo-elastic loss than aluminum.

After the bottom electrode 44 has been deposited, the piezoelectric layer 54 is deposited. The preferred material for the piezoelectric layer is sputter-deposited AlN. Since the deposition of the AlN to form a piezoelectric layer is well known in the art, the deposition process will not be described. In the preferred embodiment, the piezoelectric layer has a thickness between 0.1 $\mu$m and 10 $\mu$m.

As previously noted, the bottom electrode 44 extends across the entirety of the depression 48 that was formed in FIG. 5, but which now includes the sacrificial layer 52. In FIG. 8, the piezoelectric layer 54 extends beyond the edge of the bottom electrode 44, so that the columnar piezoelectric material has a poorly formed step edge 56 that resides on the surface of the substrate 46. This is in contrast to the unsupported step edge 40 of the prior approach shown in FIGS. 3 and 4.

In the next step, a top electrode 58 is deposited. The top electrode is also preferably constructed of molybdenum. After the layer stack of the FBAR 42 has been formed, the sacrificial layer 52 is removed from the previously formed depression. From a practical point of view, the PSG material may be removed by drilling holes within the layer stack in order to provide access to the sacrificial material by the previously described dilute $H_2O$:HF solution. However, it has been determined that by limiting the release holes to the perimeter of the depression 48, a higher Q can be achieved. Referring to the top view of FIG. 10, peripheral HF release holes 60 are formed to provide a means for removing the sacrificial material from the depression 48. This still leaves the layer stack with an unsupported interior region and four integral peripheral regions that are attached to the surface of the substrate 46.

As shown in the top view of FIG. 10, the top electrode 58 overlaps only one of the edges of the depression 48. While the parasitic nature of the FBAR is relatively small, the effects can be controlled by forming an electrode-piezoelectric-electrode sandwich only over one portion of the silicon substrate 46.

Figure 11:
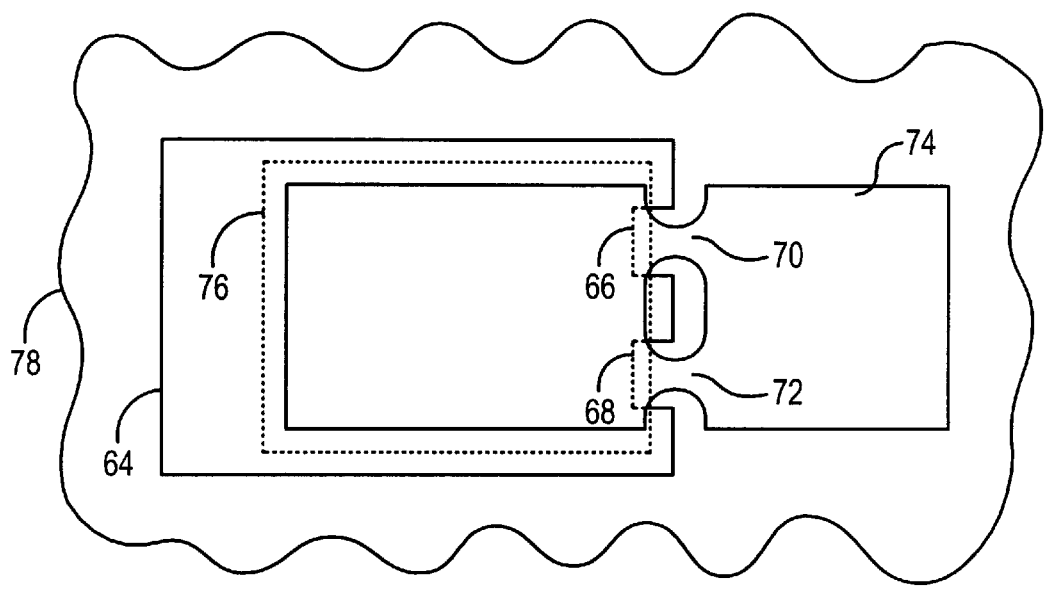
FIG. 11 is a top view of an FBAR formed in accordance with another embodiment of the invention.

FIG. 11 is a top view of another embodiment of an FBAR 62 formed in accordance with the invention. This embodiment may be referred to as a "tongue-and-groove arrangement," since the bottom electrode 64 includes one or more recesses 66 and 68 through which narrowed portions 70 and 72 of the top electrode 74 pass. The cavity 76 within the substrate 78 is shown by dashed lines, since-the cavity is covered by the top electrode and the bottom electrode. As can be seen in the top view, the top electrode 74 overlaps the bottom electrode 64 only in areas over the cavity 76. Although the Q of the FBAR 62 is slightly less than the Q for the FBAR 42 of FIG. 9 and there is a slightly greater risk of cracking, the FBAR 62 has the benefit of eliminating any parasitic coupling to the underlying substrate 78. The risk of cracking is only slightly increased, since the bottom electrode 64 still extends beyond all of the edges of the cavity 76 and since the regions in which the columnar piezoelectric material (not shown) "steps down" from the bottom electrode are minimal.

Figure 12:
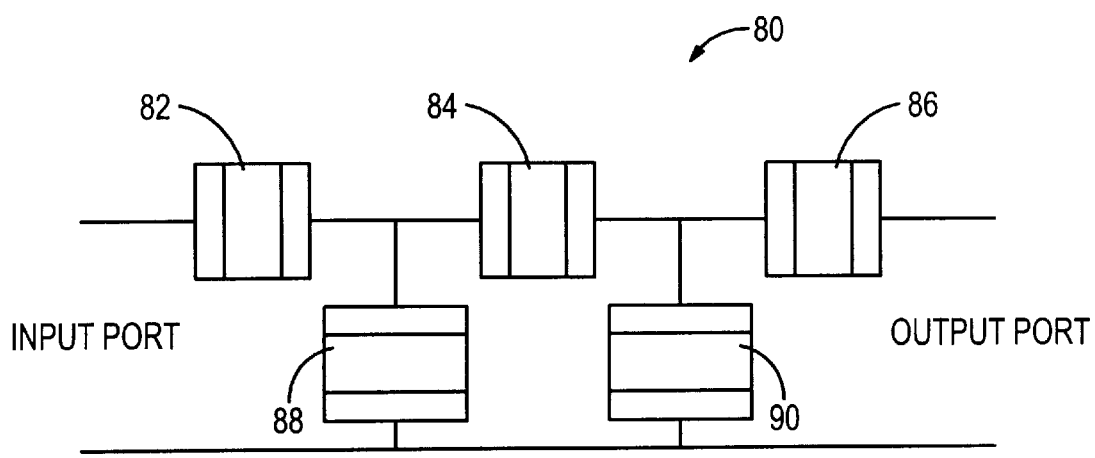
FIG. 12 is a schematic view of a filter having FBARs that are formed in accordance with the invention.

Referring now to FIG. 12, a filter 80 having a half-ladder topology is shown as including five resonators 82, 84, 86, 88 and 90. Each of the resonators is formed in accordance with the invention described above. Resonators 82, 84 and 86 are connected in series, while the resonators 88 and 90 are shunt resonators that may be connected to electrical ground. As is known in the art, the primary difference between the series and shunt resonators is the selection of center frequencies. In the case of the half-ladder topology, the shunt resonators are tuned to a lower frequency than the series resonators.

It has been found that in order to achieve a high filter Q (manifested in step skirts, low insertion loss in the pass band, and high selectivity per stage), each resonator 82, 84, 86, 88 and 90 must have the highest Q possible. To implement this, each resonator should have its own cavity, with the bottom electrodes spanning all four sides of the cavity, as shown in FIG. 11.

Figure 13:
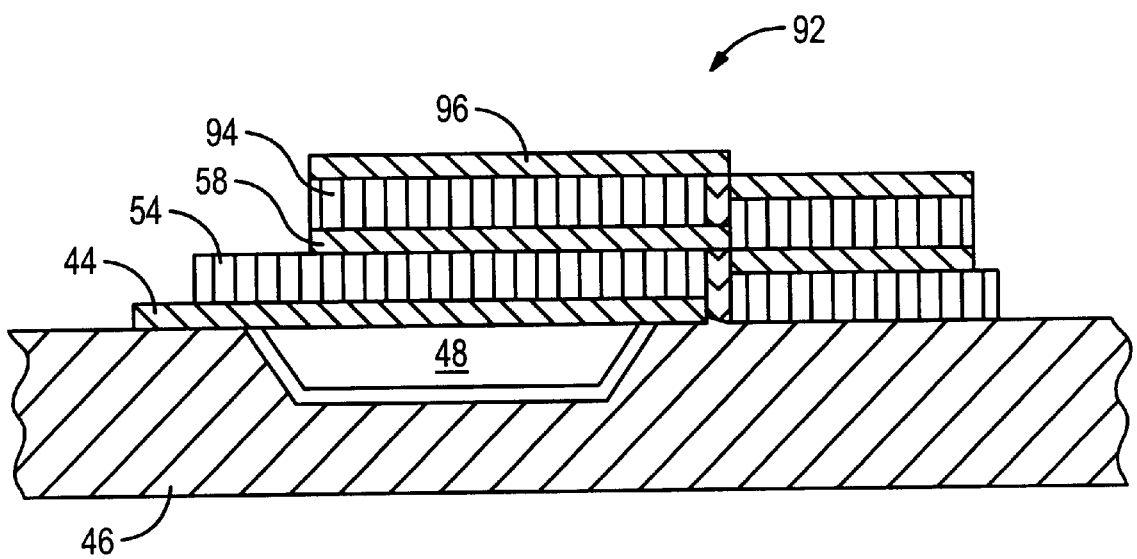
FIG. 13 is a side sectional view of an SBAR formed in accordance with the principles of FIGS. 8–10.

While the fabrication process has been described and illustrated with respect to forming an FBAR, the process applies equally to the formation of an SBAR, as illustrated in FIG. 13. An SBAR layer stack 92 includes a bottom electrode 44, a piezoelectric layer 54, and an electrode 58. These layers can be functionally and structurally identical to those described with reference to FIG. 9, except the thickness of the electrode 58 is important since another piezoelectric layer 94 is formed atop the electrode 58. Consequently, the electrode 58 should have a thickness of no greater than 1000Å. Another electrode 96 is formed atop the piezoelectric layer 94. The above-identified processes for forming the first piezoelectric layer 54 and the electrode 58 apply to the formation of the second piezoelectric layer 94 and the new electrode 96. Optionally, additional piezoelectric layers and electrodes may be added.

The SBAR layer stack 92 includes an unsupported interior region that resides over the depression 48 within the substrate 46. The bottom electrode 44 includes four peripheral regions that are in contact with the surface of the substrate 46 or with an intermediate layer that is formed on the surface of the substrate.

While the sacrificial layer has been described as being formed of PSG, other materials may be used. For example, other forms of glass, such as spin-on-glass may be utilized. In addition, there are plastics such as polyvinyl, polypropylene and polystyrene that can be deposited either by spinning on the material or depositing the material while the substrate resides within a special chamber. The sacrificial layers can be removed using an organic stripper or $O_2$ plasma etch. As with the PSG sacrificial layer, polishing is critical with these materials, since the surfaces of these materials are typically not atomically smooth.

The preferred embodiment of the invention is one in which the substrate open area that is spanned by the bottom electrode is formed by creating the depression 48 described above. However, the spanning bottom electrode may also be utilized with devices in which an open area is formed by creating a cavity entirely through the substrate.

What is claimed is:

1. A method of fabricating an acoustic resonator on a substrate comprising the steps of:

forming a bottom electrode on a suspension region of said substrate such that said bottom electrode has edges extending beyond each boundary of said suspension region;

forming piezoelectric material on said bottom electrode such that at least one piezoelectric edge of said piezoelectric material extends beyond a corresponding edge of said bottom electrode, so that said at least one piezoelectric edge resides on a surface of said substrate; and forming a top electrode on said piezoelectric material;

including leaving said edges in contact with all sides of said suspension region and freeing an interior area of said bottom electrode from contact with said substrate.

2. The method of claim 1 wherein said step of forming said top electrode includes depositing a conductive material such that opposed edges of said top electrode reside within an area aligned with said suspension region.

3. The method of claim 2 wherein said step of depositing said conductive material includes defining said top electrode to have a perimeter with a major portion residing within said area aligned with said suspension region.

4. The method of claim 1 further comprising a step of forming a cavity in said suspension region of said substrate, thereby freeing said interior region of said bottom electrode.

5. The method of claim 4 wherein said step of forming said cavity includes:

forming a depression into said substrate;

filling said depression with a sacrificial material;

depositing said bottom electrode over said sacrificial layer and onto said substrate such that said bottom electrode extends beyond each said boundary of said suspension region; and removing said sacrificial material after said steps of forming said bottom and top electrodes and said piezoelectric material.

6. The method of claim 5 wherein said step of forming said cavity further includes forming release areas for removal of said sacrificial material.

7. The method of claim 5 wherein said step of forming said cavity further includes providing a protective layer in said depression to inhibit diffusion of said sacrificial material into said substrate.

8. The method of claim 1 wherein:

said step of forming said bottom electrode includes leaving at least one portion of the perimeter of said suspension region free of overlap by said bottom electrode, while maintaining contact of said bottom electrode with all of said sides of said suspension region; and said step of forming said top electrode includes restricting said top electrode to overlapping said perimeter of said suspension region at said at least one portion.

9. A method of fabricating an acoustic resonator comprising:

forming a layer stack on a substrate such that said layer stack has an interior region that is unsupported and has a first electrode layer that extends from said unsupported interior region to supported peripheral regions at each side of said substrate, said layer stack being formed to include an active layer that is responsive to an applied electrical field to generate acoustic waves and to include a second electrode layer on a side of said active layer opposite to said substrate and said first electrode layer, said layer stack including a piezoelectric layer having an edge portion that extends beyond said first electrode layer and that contacts said substrate.

10. The method of claim 9 wherein said step of forming said layer stack includes forming said active layer of a piezoelectric material and includes forming said first and second electrodes of conductive material.

11. The method of claim 9 wherein said step of forming said layer stack includes connecting said supported peripheral regions of said first electrode layer to said substrate, said unsupported interior region having four sides, said supported peripheral regions being at each of said four sides.

12. The method of claim 9 further comprising a step of forming a cavity partially through said substrate to provide a space between said substrate and said unsupported interior region of said layer stack.

13. The method of claim 9 wherein said step of forming said layer stack includes depositing said second electrode layer to extend over only one of said supported peripheral regions and over only a portion of said unsupported interior region.

14. The method of claim 9 wherein said step of forming said layer stack includes forming a plurality of said active layers between electrode layers.

15. An acoustic resonator comprising:

a substrate having an upper surface with an open area;

an active layer stack on said upper surface and over said open area, said active layer stack including a bottom electrode and a top electrode on opposite sides of a piezoelectric layer, said bottom electrode extending across said open area and connecting to said substrate to provide an unsupported interior region and a supported peripheral region on each major side of said open area, said unsupported interior region being substantially surrounded by said supported peripheral regions, said piezoelectric layer having an edge that extends beyond said bottom electrode, such that said edge resides on said substrate.

16. The acoustic resonator of claim 15 wherein said open area is a cavity in said substrate, said cavity having a configuration indicative of anisotropic etching from said upper surface through a portion of said substrate.

17. The acoustic resonator of claim 16 wherein said cavity is substantially enclosed by said active layer stack, with only release holes being available to enable formation of said cavity.

18. The acoustic resonator of claim 17 wherein said release holes are limited to a periphery of said cavity.

19. The acoustic resonator of claim 15 wherein said top electrode extends over said open area of said upper surface and crosses over only one of said major sides of said open area.

20. The acoustic resonator of claim 19 wherein said major surfaces are four in number.

21. A filter having a plurality of first acoustic resonators connected in series and a plurality of second acoustic resonators connected in parallel between adjacent first acoustic resonators, said first and second acoustic resonators being formed on a substrate and each of said first acoustic resonators and said second acoustic resonators comprising:

a bottom electrode in contact with each side of a cavity in said substrate such that each said first and second acoustic resonator has a separate cavity, said bottom electrode having at least one edge that is extended beyond said side of said cavity, such that said at least one edge is in contact with said substrate;

a piezoelectric layer on said bottom electrode, said piezoelectric layer having at least one piezoelectric edge that is extended beyond said bottom electrode, such that said at least one piezoelectric edge is in contact with said substrate; and a top electrode on said piezoelectric layer on a side opposite to said bottom electrode.

\* \* \* \* \*